United States Patent

[11] 3,611,068

[72] Inventor Takashi Fujita
Toyonaka, Japan
[21] Appl. No. 37,491
[22] Filed May 20, 1970
[45] Patented Oct. 5, 1971
[73] Assignee Matsushita Electric Industrial Co., Ltd.
Osaka, Japan
Continuation of application Ser. No. 749,019, July 31, 1968, now abandoned.

[54] CONTACTLESS PRESSURE SENSITIVE SEMICONDUCTOR SWITCH
2 Claims, 3 Drawing Figs.

[52] U.S. Cl. .................... 317/235 R, 317/234 E, 317/234 G, 317/235 M, 179/110
[51] Int. Cl. .................... H01l 15/00, H01l 11/00
[50] Field of Search .................... 179/110; 317/234, 235, 1, 4, 26; 29/587, 588, 589

[56] References Cited

UNITED STATES PATENTS

| | | | |
|---|---|---|---|
| 3,132,408 | 5/1964 | Pell | 317/235 |
| 3,284,750 | 11/1966 | Komatsubara | 317/235 |
| 3,310,502 | 3/1967 | Komatsubara et al. | 317/235 |
| 3,403,307 | 9/1968 | Rindner | 317/235 |
| 3,102,420 | 9/1963 | Mason | 73/88.5 |
| 2,469,569 | 5/1949 | Ohl | 317/235 X |
| 3,335,233 | 8/1967 | Zerbst | 317/235 X |

FOREIGN PATENTS

| | | | |
|---|---|---|---|
| 1,055,418 | 1/1967 | Great Britain | 317/235 |

*Primary Examiner*—John W. Huckert
*Assistant Examiner*—Andrew J. James

ABSTRACT: A contactless switching device in which the conventional switch contacts are replaced by a semiconductor element whose resistivity is remarkably reduced when a pressure is imposed thereon.

PATENTED OCT 5 1971 3,611,068

INVENTOR
TAKASHI FUJITA

BY Stevens, Davis, Miller & Mosher

ATTORNEYS

CONTACTLESS PRESSURE SENSITIVE SEMICONDUCTOR SWITCH

This is a continuation of Ser. No. 749,019 filed July 31, 1968 now abandoned.

This invention relates to a contactless switching device in which the conventional switch contacts are replaced by a semiconductor element whose resistivity is remarkably reduced if a pressure is imposed thereon.

A conventional switching device in which the switching operation is performed by making and breaking of a pair of switch contacts, has various disadvantages including wear of the contacts due to the arc produced thereat each time an electric current is cut off.

On the other hand, a known solid-state semiconductor switch such as a thyrister has a different disadvantage in that it can be controlled only with the aid of an elaborate electric means such as a pulse generator which supplies a pulse current to the gate electrode.

The above-mentioned disadvantage of the conventional switching means have been overcome by this invention which comprises a pressure-sensitive element and a pressure imposing mechanism which is operated so as to impose a pressure on said pressure-sensitive element.

The pressure-sensitive element comprises a semiconductor body such as Si, Ge, ZnS or CdS doped with an impurity which forms a deep level in the semiconductor, the opposite surfaces of said body being provided with electrodes of Au-Sb, and the resistivity of said element is remarkably reduced when a pressure is imposed on said electrodes.

Figure 1:
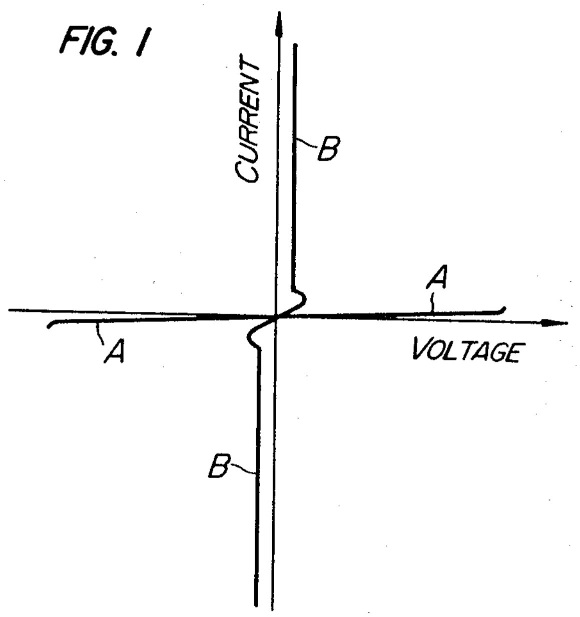

Electrical characteristics of said pressure-sensitive element is indicated by the diagram shown in FIG. 1, in which trace B represents a relation between the electric current passing through the element and voltage applied to it with a pressure imposed equally on the opposite surfaces of the semiconductor element that is symmetrical with respect to said opposite surfaces. Trace A shows a similar relation when the pressure is removed.

Figure 2:
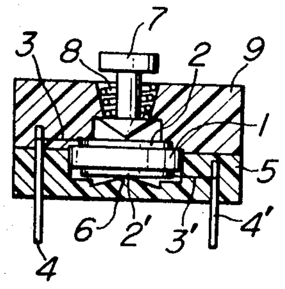
Figure 3:
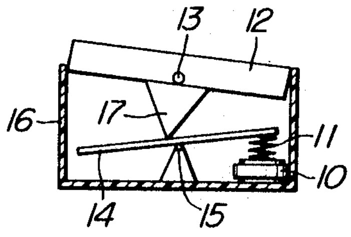

Now, this invention will be explained in detail in connection with embodiments of the invention referring to the attached drawings, in which;

FIG. 2 is a sectional view of an embodiment of the contactless switch according to this invention; and FIG. 3 is a sectional view of another embodiment of the contactless switch.

Referring to FIG. 2, reference numeral 1 indicates the pressure-sensitive element, 2 and 2' electrodes attached to the element 1, numerals 3 and 3' lead wires, 4 and 4' terminals of the switch, 5 a base on which said element 1 is secured, 6 a bottom pusher against the element 1, numeral 7 a top pusher, 8 a spring for retaining said top pusher 7, and numeral 9 indicates a casing. The operation of this contactless switch is as follows: When the top pusher 7 is in OFF state being kept spaced from the electrode 2 of the element 1 by means of the spring 8, no pressure is imposed on the element 1. Therefore, the element 1 is substantially nonconductive, and the switch remains in OFF-state so far as a voltage higher than the breakover voltage is not applied to the element 1. However, if the top pusher 7 is depressed for example manually to impart a pressure to the electrode 2, the element 1 receives the pressure equally from the top and bottom faces as the element is symmetrical in structure with regard to said two faces. Accordingly, the electrical characteristics of the element 1 changes from a state indicated by trace A in FIG. 1 to the state of trace B which corresponds to a conducting state of the element 1. That is; the switch is turned on by depressing the top pusher 7.

Next, referring to FIG. 3, reference numeral 10 indicates the above-described pressure-sensitive semiconductor element which is mounted in such a manner that a pressure imposed on the top face of the element induces the same pressure imposed on the bottom face; numeral 11 a buffer spring through which the pressure is applied to the element 10 and which prevents the element 10 from being damaged by impact; 12 a manipulating key pivoted by axis 13; numeral 14 a lever supported on a fulcrum 15 for pressing the element 10; numeral 16 a casing, and numeral 17 indicates the edge portion of the key 12.

The operation of this switching means is as follows: Manipulation of the key 12 around the axis 13 causes the edge portion 17 to move about the axis 13. However, as the axis is fitted so as to able to displace, the edge 17 slides along the lever 14 centering around the fulcrum 15. If the edge 17 is at a position between the fulcrum 15 and the end of the lever 14 near the element 10, a pressure is imposed on said element 10, thereby turning the switch ON. On the contrary, if the edge 17 is at the opposite side of the fulcrum 15, no pressure is imposed on said element 10 and the switch remains in an OFF-state.

As is obvious from the above descriptions of the embodiments, the switching device of this invention in which the conventional switch contacts are replaced by a semiconductor element whose resistivity is remarkably reduced if a pressure is imposed thereon, is free from wear of the contact and ensures a long operating life. Further, if the element is made of silicon, a small switch having a current capacity of a few amperes and withstanding a test voltage of a few hundreds volts will be obtained. Moreover, the switch of this invention is sufficiently heat-resistive, simple in structure and low in cost. Therefore, the contactless switching devices according to this invention will be used with great advantage for various kinds of switching purposes including common ON-OFF switches and microswitches.

I claim:

1. A contactless switching device comprising a stress-sensitive semiconductor element doped with an impurity which forms a deep energy level, said element having conductive and nonconductive states depending on the presence and absence of stress applied thereto and independently of the magnitude of said stress, contact electrodes formed of gold-antimony alloy attached to opposite sides of said element and forming a semiconductor element sandwiched structure, and means to apply stress externally and simultaneously on both sides of said element through said contact electrodes, comprising a housing, means for fixedly mounting said element in said housing, a fixed portion of said housing bearing against one electrode at one side of said element, and manually operated means acting against the other electrode at the other side of the element for stressing said element by pressing said element between it and said fixed portion whereby the resistivity of said element undergoes abrupt transition between its conductive and nonconductive states, and spring means normally biasing said manually operated means away from said element.

2. A contactless switching device according to claim 1 wherein said manually operated means comprises lever means pivotally mounted in said housing, said spring means being mounted between said electrode at the other side of said element and one end of said lever means, and actuating means slidable along said lever means to cause said lever means to pivot and thereby apply stress to said element through said spring means.